United States Patent
Yeh et al.

(10) Patent No.: US 8,063,864 B2
(45) Date of Patent: Nov. 22, 2011

(54) SWITCH ELEMENTS AND PIXELS

(75) Inventors: Chang-Ching Yeh, Penghu County (TW); Yun-Bok Lee, Tainan County (TW); Chia-Hua Yu, Taipei County (TW)

(73) Assignee: Hannstar Display Corp., New Taipei (TW)

( * ) Notice: Subject to any disclaimer, the term of this patent is extended or adjusted under 35 U.S.C. 154(b) by 785 days.

(21) Appl. No.: 11/954,271

(22) Filed: Dec. 12, 2007

(65) Prior Publication Data

US 2009/0102539 A1    Apr. 23, 2009

(30) Foreign Application Priority Data

Oct. 17, 2007  (TW) ................................. 96138845 A (51) Int. Cl.
*H03K 17/56* (2006.01)

(52) U.S. Cl. ............................. 345/92; 345/87; 345/204
(58) Field of Classification Search .................. 345/204, 345/87, 92
See application file for complete search history.

(56) References Cited

U.S. PATENT DOCUMENTS

| | | | | |
|---|---|---|---|---|
| 7,212,268 B2 * | 5/2007 | Kim | ................................ | 349/129 |
| 7,834,970 B2 * | 11/2010 | Kim | ................................ | 349/129 |
| 2002/0039161 A1 * | 4/2002 | Kim | ................................ | 349/129 |
| 2007/0247561 A1 * | 10/2007 | Kim | ................................ | 349/58 |
| 2009/0268119 A1 * | 10/2009 | Lee et al. | ........................ | 349/54 |
| 2011/0102714 A1 * | 5/2011 | Lee et al. | ........................ | 349/105 |

\* cited by examiner

*Primary Examiner* — Bipin Shalwala
*Assistant Examiner* — Afroza Chowdhury
(74) *Attorney, Agent, or Firm* — Thomas|Kayden (57) ABSTRACT

A pixel, according to the invention, comprises a pixel electrode, a data line, and a switch element. The switch element comprises a gate electrode, a first electrode, a second electrode, and a semiconductor layer. The first electrode is electrically connected to the pixel electrode and comprises a first portion and a second portion. The second portion has a curved structure and comprises a first terminal connected to the first portion and a second terminal. The first terminal of the second portion is substantially aligned with the second terminal thereof. The second electrode is electrically connected to the data line. The second electrode forms or the second electrode and the data line together form a concave area where the first electrode is disposed in. The semiconductor layer is disposed between the first electrode, the second electrode, and the gate electrode.

21 Claims, 11 Drawing Sheets

|  | FIG. 5 | FIG. 7 | FIG. 9 |
|---|---|---|---|
| $C_{gs}$ (fF) | 60.6 | 56.7 | 75.5 |
| $C_{ed}$ (fF) | 272 | 238.3 | 251.5 |
| $C_{gs}$ (fF) + $C_{gd}$ (fF) | 332.6 | 295 | 327 |
| RC delay time (ns) | 1.16 | 1.03 | 1.12 |

SWITCH ELEMENTS AND PIXELS

CROSS REFERENCE TO RELATED APPLICATIONS

This application claims the benefit of Taiwan application Serial No. 96138845 filed Oct. 17, 2007, the subject matter of which is incorporated herein by reference.

BACKGROUND OF THE INVENTION

1. Field of the Invention

The invention relates to a pixel and a switch element thereof, and more particularly to a pixel and a switch element thereof in a liquid crystal display panel.

2. Description of the Related Art

Given requirements for moving image quality, display devices driven by high frequency signals have been developed, such as a liquid crystal display (LCD) devices with a driving frequency of 120 Hz. For high frequency LCD devices, two issues for LCD design must be considered, one is RC delay time of gate lines, and the other is charging capability of thin film transistors (TFTs) within pixels. Problems relating to RC delay time of gate lines are solved by forming gate lines from low impedance metal materials. As for charging capability of TFTs within pixels, the channel width of the TFTs within the pixels is increased to enhance the charging capability of TFTs.

Figure 1:
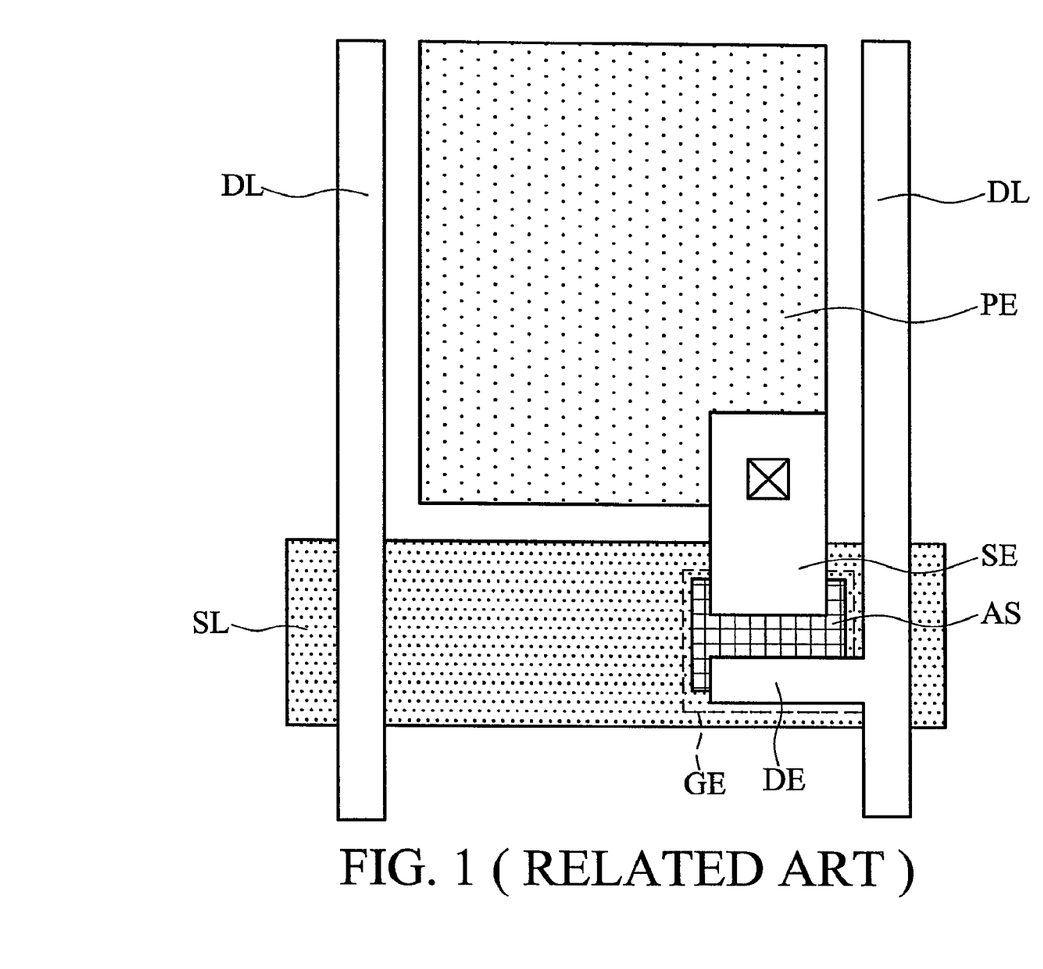
FIG. 1 shows a conventional thin film transistor of a pixel in a driving frequency of 60 Hz.
Figure 2:
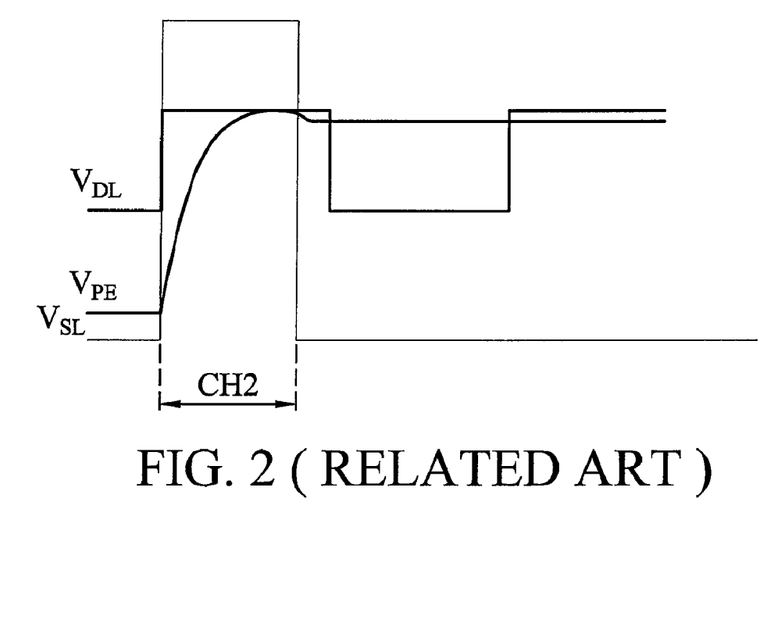
FIG. 2 shows voltage $V_{PE}$ of the pixel electrode PE, voltage $V_{DL}$ of the data line DL, and voltage $V_{SL}$ of the scan line SL of the pixel of FIG. 1 in a driving frequency of 60 Hz.
Figure 3:
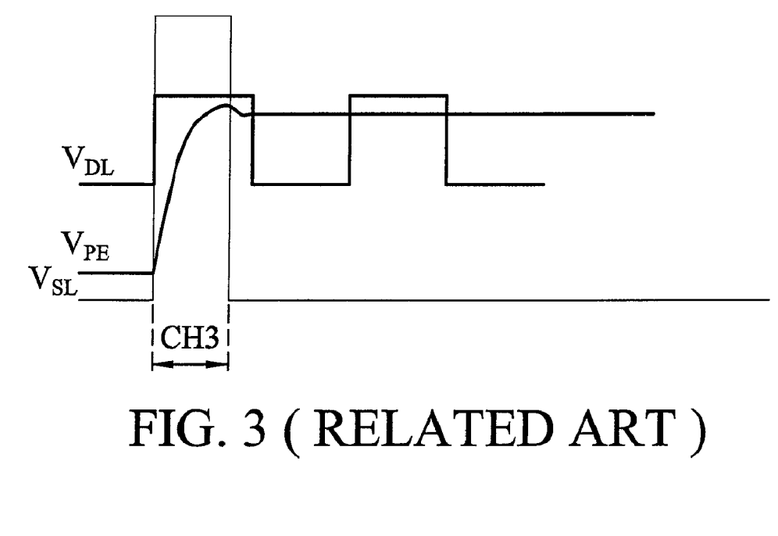
FIG. 3 shows voltage $V_{PE}$ of the pixel electrode PE, voltage $V_{DL}$ of the data line DL, and voltage $V_{SL}$ of the scan line SL of the pixel of FIG. 1 in a driving frequency of 120 Hz.

FIG. 1 shows a conventional thin film transistor of a pixel in a driving frequency of 60 Hz. A source electrode SE is electrically connected to a pixel electrode PE. A drain electrode DE is electrically connected to a data line DL. A gate electrode GE is electrically connected to a scan line SL. An amorphous semiconductor layer AS is disposed between the source and drain electrodes SE and DE and the gate electrode GE. The scan line SL comprises the gate electrode GE, in other words, the gate electrode GE is provided by a part of the scan line SL. FIG. 2 shows voltage $V_{PE}$ of the pixel electrode PE, voltage $V_{DL}$ of the data line DL, and voltage $V_{SL}$ of the scan line SL of the pixel of FIG. 1 in a driving frequency of 60 Hz. According to FIG. 2, during a predetermined charging time $T_{CH2}$, the voltage $V_{PE}$ of the pixel electrode PE rises and is almost equal to the voltage $V_{DL}$. The charging capability of the TFT is approximately equal to 99%. FIG. 3 shows voltage $V_{PE}$ of the pixel electrode PE, voltage $V_{DL}$ of the data line DL, and voltage $V_{SL}$ of the scan line SL of the pixel of FIG. 1 in a driving frequency of 120 Hz. Referring to FIG. 3, since the charging time $T_{CH3}$ is shorter than the charging time $T_{CH2}$, the charging capability of the TFT is greatly degraded.

Figure 4:
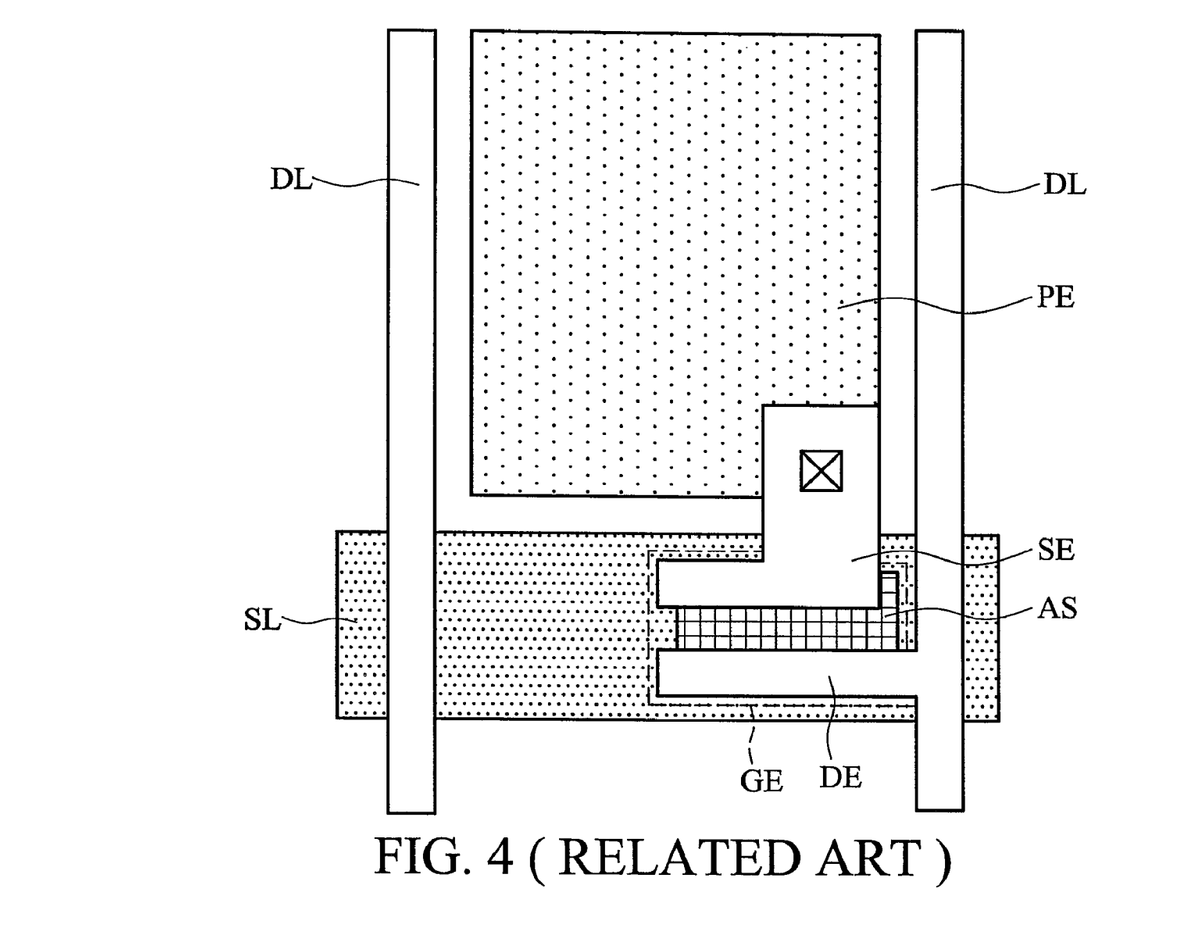
FIG. 4 shows one conventional TFT with an increased channel width.

FIG. 4 shows one conventional TFT with an increased channel width. Referring to FIG. 4, area of the gate electrode GE, the drain electrode DE, and the amorphous semiconductor layer AS are increased to increase the channel width of the TFT. Thus, the charging capability of the TFT is enhanced to 90% in driving frequency of 120 Hz. However, a gate-source capacitor ($C_{gs}$) and a gate-drain capacitor ($C_{gd}$) are also increased, resulting in increase of RC delay time.

Figure 5:
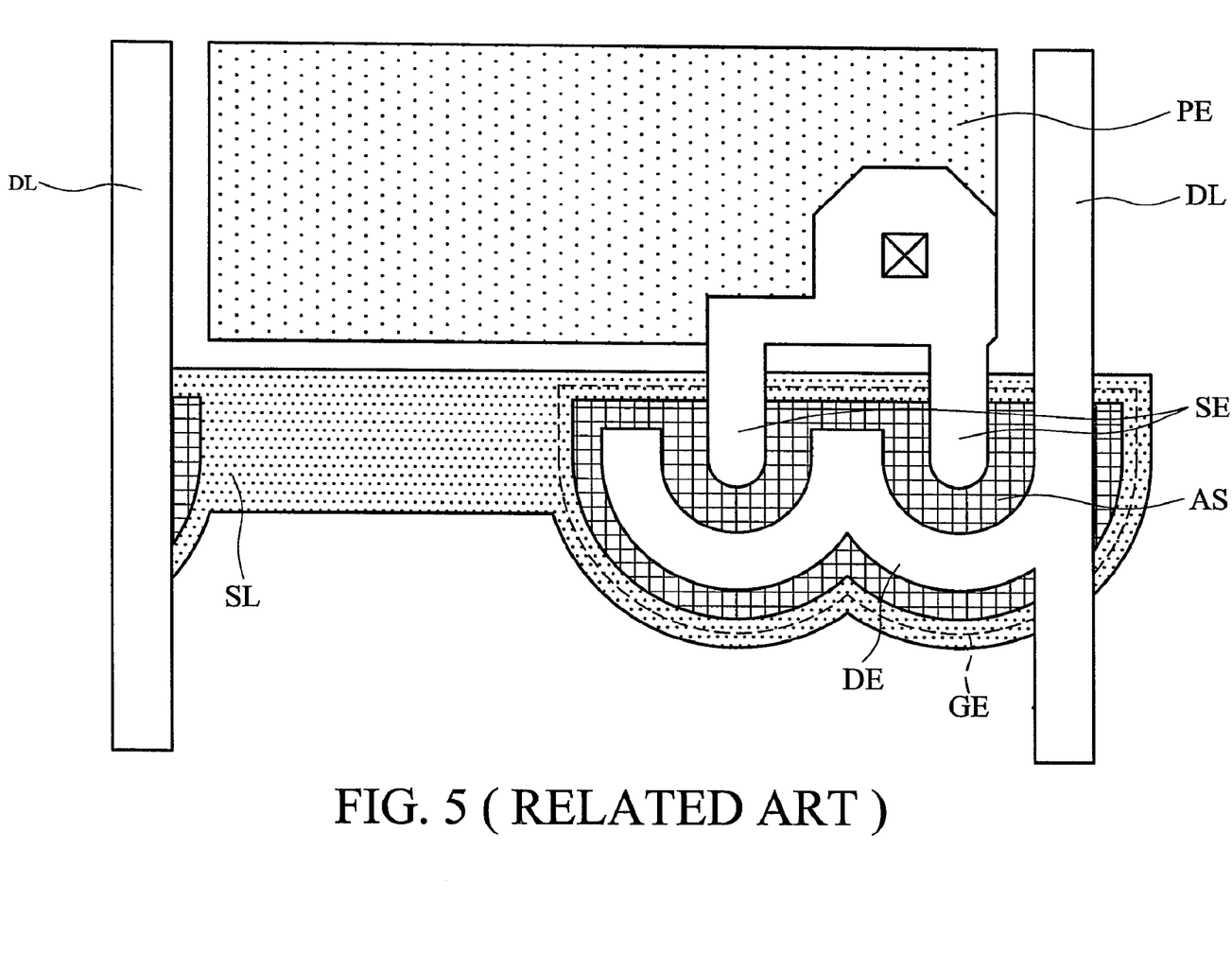
FIG. 5 shows another conventional TFT with an increased channel width.

FIG. 5 shows another conventional TFT with an increased channel width. Referring to FIG. 5, a drain electrode is formed by "UU" form to increase channel width. The channel width is increased, and a gate-source capacitor ($C_{gs}$) is decreased. However, a gate-drain capacitor ($C_{gd}$) is greatly increased, resulting in increase of RC delay time. Moreover, the TFT with the "UU" form occupies a large area, and aperture ratio of pixels is decreased.

BRIEF SUMMARY OF THE INVENTION

An exemplary embodiment of a switch element according to the invention comprises a gate electrode, a first electrode, a second electrode, and a semiconductor layer. The first electrode is electrically connected to the pixel electrode and comprises a first portion and a second portion. The second portion has a curved structure and comprises a first terminal connected to the first portion and a second terminal. The first terminal of the second portion is substantially aligned with the second terminal thereof, and there is a first distance between the first terminal and the second terminal of the second portion. The second electrode forms a concave area where the first electrode is disposed in. The semiconductor layer is disposed between the first electrode, the second electrode, and the gate electrode.

An exemplary embodiment of a pixel according to the invention comprises a pixel electrode, a data line, and a switch element. The switch element comprises a gate electrode, a first electrode, a second electrode, and a semiconductor layer. The first electrode is electrically connected to the pixel electrode and comprises a first portion and a second portion. The second portion has a curved structure and comprises a first terminal connected to the first portion and a second terminal. The first terminal of the second portion is substantially aligned with the second terminal thereof, and there is a first distance between the first terminal and the second terminal of the second portion. The second electrode is electrically connected to the data line. The second electrode forms or the second electrode and the data line together form a concave area where the first electrode is disposed in. The semiconductor layer is disposed between the first electrode, the second electrode, and the gate electrode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 6:
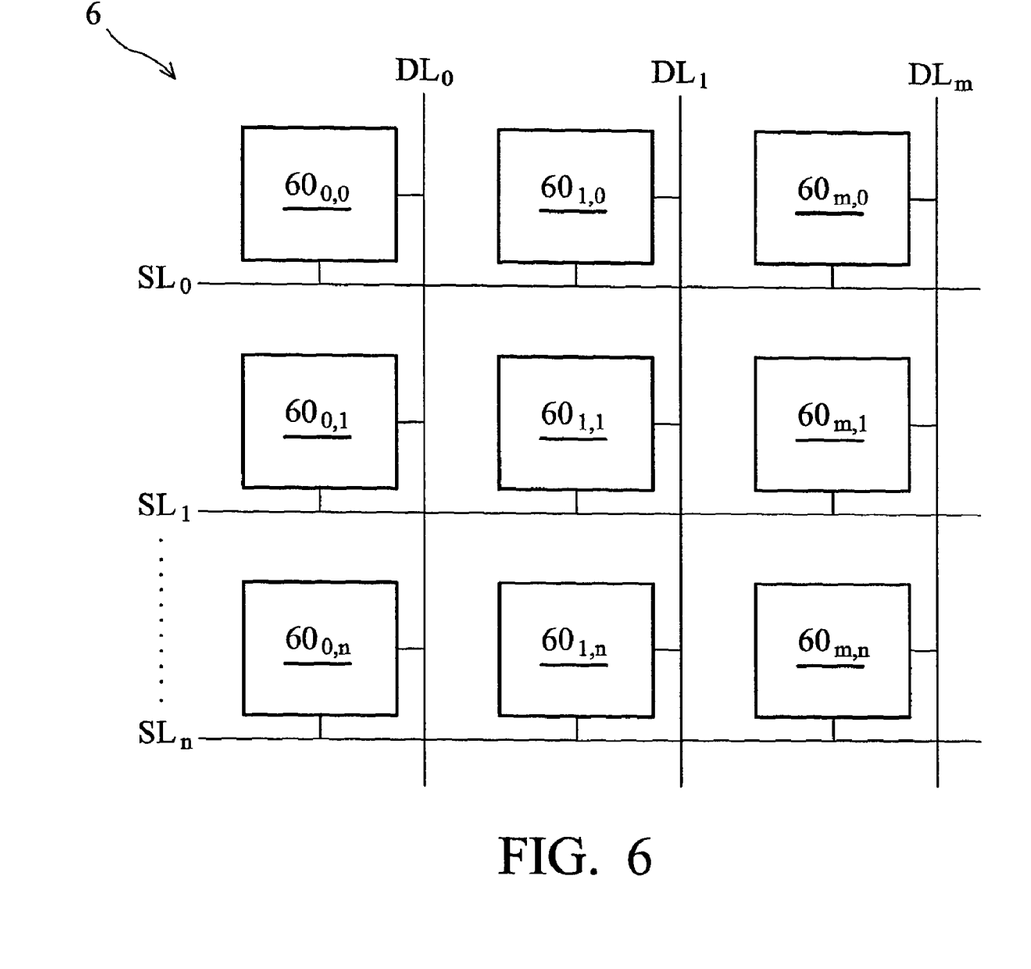
FIG. 6 shows an exemplary embodiment of a display panel according to the invention.

Display panels are provided. In an exemplary embodiment of a display panel in FIG. 6, a display panel 6 comprises a plurality of scan lines $SL_0$-$SL_n$, a plurality of data lines $DL_0$-$DL_n$, and a plurality of pixels $60_{0,0}$-$60_{m,n}$. The scan lines $SL_0$-$SL_n$, and the data lines $DL_0$-$DL_n$ are intersected, and each of the intersected scan lines and data lines defines a pixel. For example, the intersected scan line $SL_1$ and data line $DL_0$ define the pixel $60_{1,0}$. Each pixel comprises a pixel electrode and a switch element electrically connected to the pixel electrode. The switch element comprises a gate electrode, a first electrode, a second electrode, and a semiconductor layer AS. In this embodiment, the switch element is a switch transistor, wherein the first and second electrodes are respectively source and drain electrodes of the switch transistor or drain and source electrodes thereof. The switch transistor can be a thin film transistor or other types of transistors. According to the type of the switch transistor, such as an N type or P type transistor, when the first electrode is defined as a source or drain electrode, the second electrode is defined as a drain or source electrode. In the following, it is assumed that the first electrode is defined as a source electrode, and the second electrode is defined as a drain electrode.

Figure 7:
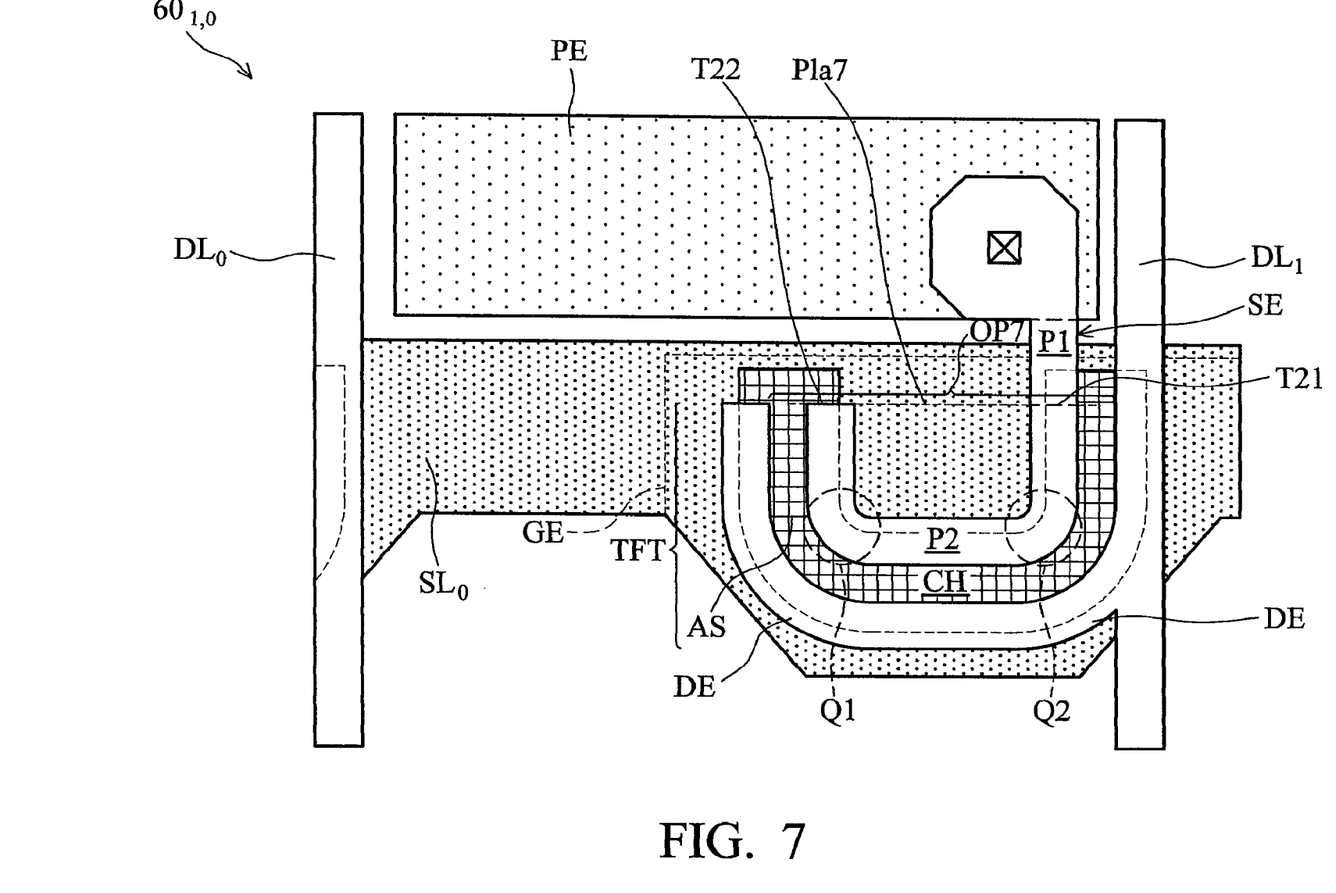
FIG. 7 shows an exemplary embodiment of a switch transistor in the pixel of FIG. 6.

Referring to FIG. 7, the pixel $60_{1,0}$ is given as an example to describe the electrode disposition in the switch element of each pixel. The pixel $60_{1,0}$ comprises a pixel electrode PE and a switch transistor TFT. The switch transistor TFT comprises a gate electrode GE, a source electrode SE, a drain electrode DE, and a semiconductor layer AS. Referring to FIG. 7, the source electrode SE is electrically connected to the pixel electrode PE and comprises a first portion P1 and a second portion P2. The first portion P1 of the source electrode SE is formed in a straight shape. The second portion P2 of the source electrode SE has a curved structure and comprises a first terminal T21 connected to the first portion P1 and a second terminal T22, wherein the first terminal T21 is substantially aligned with the second terminal T22. As shown in FIG. 7, the first terminal T21 is substantially aligned with the second terminal T22 on a plane Pla7. The gate electrode GE is electrically connected to the scan line $SL_0$ and disposed under the source electrode SE and the drain electrode DE. In this embodiment, the scan line $SL_0$ comprises the gate electrode GE. In some embodiments, the gate electrode GE can be independent of the scan line $SL_0$ and is electrically connected to the scan line $SL_0$ by other connections. The drain electrode DE is electrically connected to the data line $DL_1$ and at least, disposed along the second portion P2. The semiconductor layer AS is disposed between the source and drain electrodes SE and DE and the gate electrode GE and along the source and drain electrodes SE and DE. In FIG. 7, the second portion P2 of the source electrode SE is formed in a curved shape of a "U" form. The curved shape of a "U" form comprises two corners Q1 and Q2, and the corners Q1 and Q2 are preferably at 90 degrees. In some embodiments, the second portion P2 of the source electrode SE can be formed in a curved shape of a semicircle or other types of curved shapes. Moreover, in some embodiments, preferably, the second portion P2 of the source electrode SE can be formed in a symmetrical shape, such as the first terminal T21 is symmetrical to the second terminal T22. The drain electrode DE forms a concave area having an opening OP7. The source electrode SE's main portion is disposed in the concave area.

Referring to FIG. 7, the semiconductor layer AS partly overlaps the source electrode SE and partly overlaps the drain electrode DE. In some embodiments, the semiconductor layer AS can completely overlap each of the source electrode SE and the drain electrode DE. The semiconductor layer AS between the source electrode SE and the drain electrode DE forms a channel CH which comprises a curved portion and a first straight portion parallel with the first portion P1. As shown in FIG. 7, the curved portion of the channel CH is between the curved structure of the second portion P2 and the drain electrode DE. In the embodiment of FIG. 7, the first straight portion of the channel CH is the right part of the channel CH. The first straight portion is formed between the data line $DL_1$ and the source electrode SE and extends toward the same direction as the first portion P1. The channel CH further comprises a second straight portion parallel with the first portion P1. The second straight portion of the channel CH is the left part of the channel CH. The second straight portion is formed between the drain electrode DE and the second portion P2 of the source electrode SE and extends toward the same direction as the first portion P1. As shown in FIG. 7, the first and second straight portions are respectively disposed on two sides of the curved portion. The semiconductor layer AS can be formed by an amorphous layer or other semiconductor structures. According to above description, the channel CH comprises a shape of a "C" form or a semicircle, or the channel CH is formed in a curved shape of a "U" form.

According to the switch transistor TFT in FIG. 7, when the driving frequency of the display panel 6 is 120 Hz, charging capability of the switch element is enhanced due to the increased channel length. Moreover, when a mask alignment error between the semiconductor layer AS and the source/drain electrode SE/DE results in drift of the corresponding positions of the semiconductor layer AS and the source/drain electrode SE/DE during the process, the process inaccuracy can be compensated by the left and right sides of the switch transistor TFT. The overlapping area between the semiconductor layer AS and the source/drain electrode SE/DE can remain equal and not be affected by the mask alignment error. Due to the process compensation, the gate-source capacitor between the gate electrode GE and the source electrode SE is not changed when the mask alignment error occurs, and feed through voltage is not affected.

Figure 8:
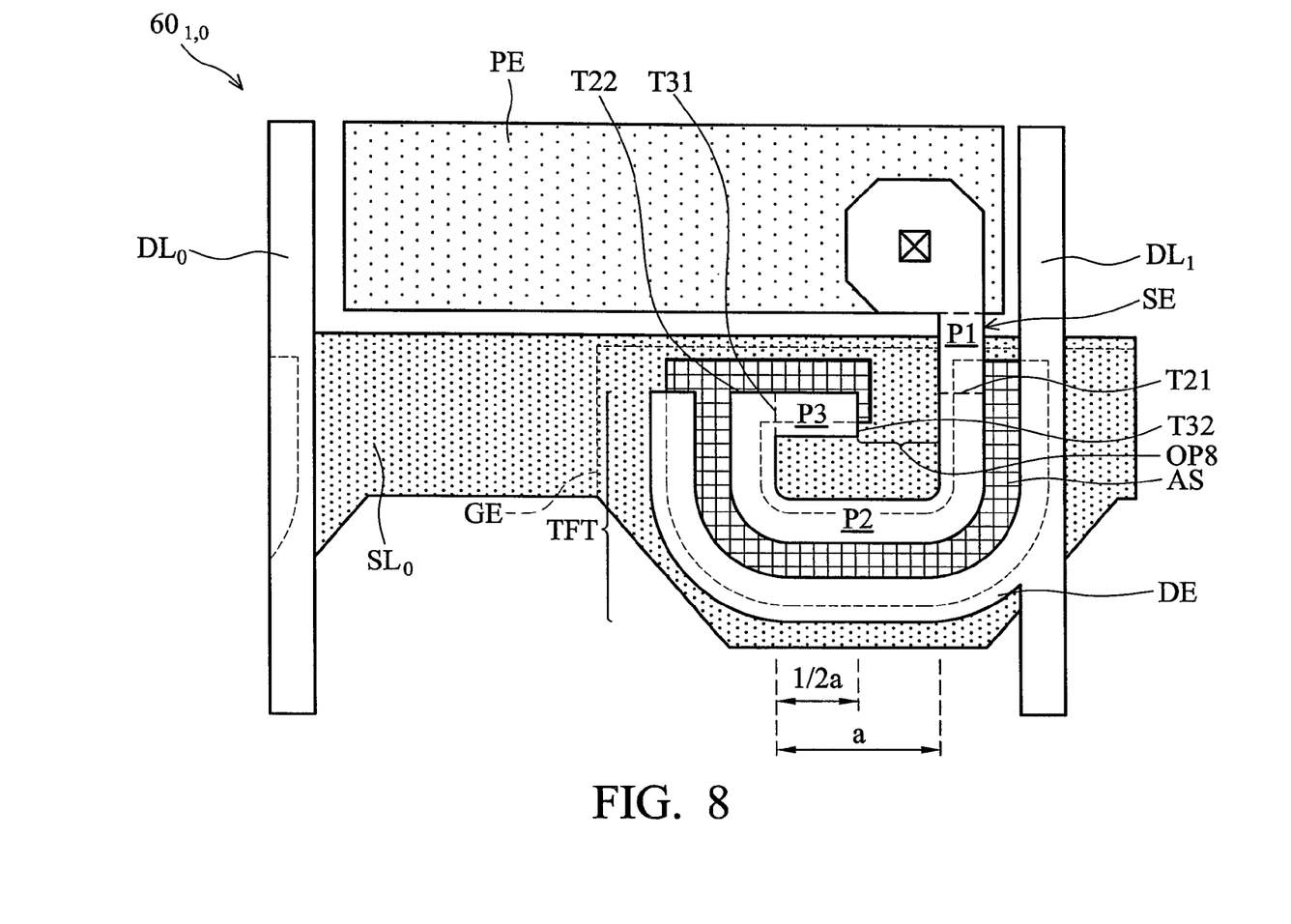
FIG. 8 shows one exemplary embodiment of a switch transistor according to the invention.

FIG. 8 is another exemplary embodiment of a switch transistor according to the invention. As shown in FIG. 8, the difference between FIG. 8 and FIG. 7 is that the source electrode SE further comprises a third portion P3. The third portion P3 comprises a first terminal T31 and a second terminal T32. The first terminal T31 of the third portion P3 is connected to the second terminal T22 of the second portion P2. The third portion P3 extends from the second terminal T22 of the second portion P2 to the first terminal T21 and is not connected to the first terminal T21. An opening OP8 is thus formed between the second terminal T32 of the third portion P3 and the first terminal T21 of the second portion P2. The opening OP8 corresponding to the opening OP7 of the concave area. As shown in FIG. 8, the third portion P3 is formed in a straight shape. In some embodiments, the shape of the third portion P3 can be formed in a curved shape according to applications, without limitation.

In FIG. 8, the distance between the first terminal T21 and the second terminal T22 of the second portion P2 is equal to a, and the distance between the second terminal T32 of the third portion P3 and the first terminal T21 of the second portion P2 is equal to a/2. In other words, the extended length of the third portion P3 is equal to a/2. In some embodiments, the extended length of the third portion P3 can be determined according to applications, such as a/3, without limitation.

Figure 9:
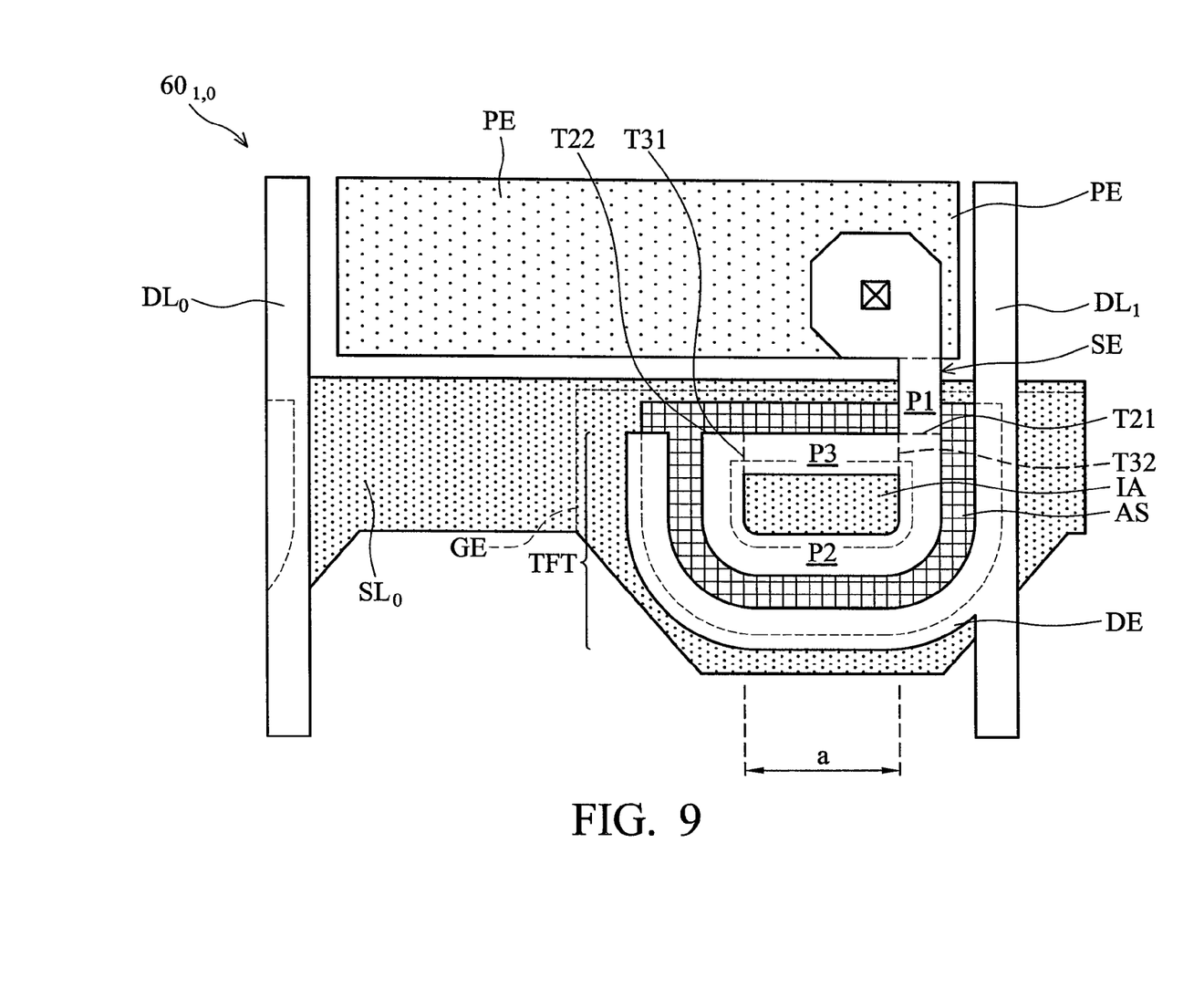
FIG. 9 shows another exemplary embodiment of a switch transistor of FIG. 8.

In some embodiments, the second terminal T32 of the third portion P3 is connected to the first terminal T21 of the second portion P2, as shown in FIG. 9. The second and third portions P2 and P3 form an internal area IA together. Since the second terminal T32 is connected to the first terminal T21, the extended length of the third portion P3 is equal to a.

According to FIGS. 8 and 9, since the source electrode SE comprises the third portion P3, the semiconductor layer AS is further disposed along the third portion P3.

According to the switch transistor TFT in FIG. 8, since the source electrode SE comprises the third portion P3, process inaccuracy can be partially compensated by the up and down sides of the switch transistor TFT and totally compensated by the left and right sides of the switch transistor TFT. The overlapping area between the semiconductor layer AS and the source/drain electrode SE/DE can substantially remain equal and not be affected by the mask alignment error. According to the switch transistor TFT in FIG. 9, since the third portion P3 is connected to the second portion P2, process inaccuracy can be totally compensated by the up, down, left, and right sides of the switch transistor TFT.

Figure 10:
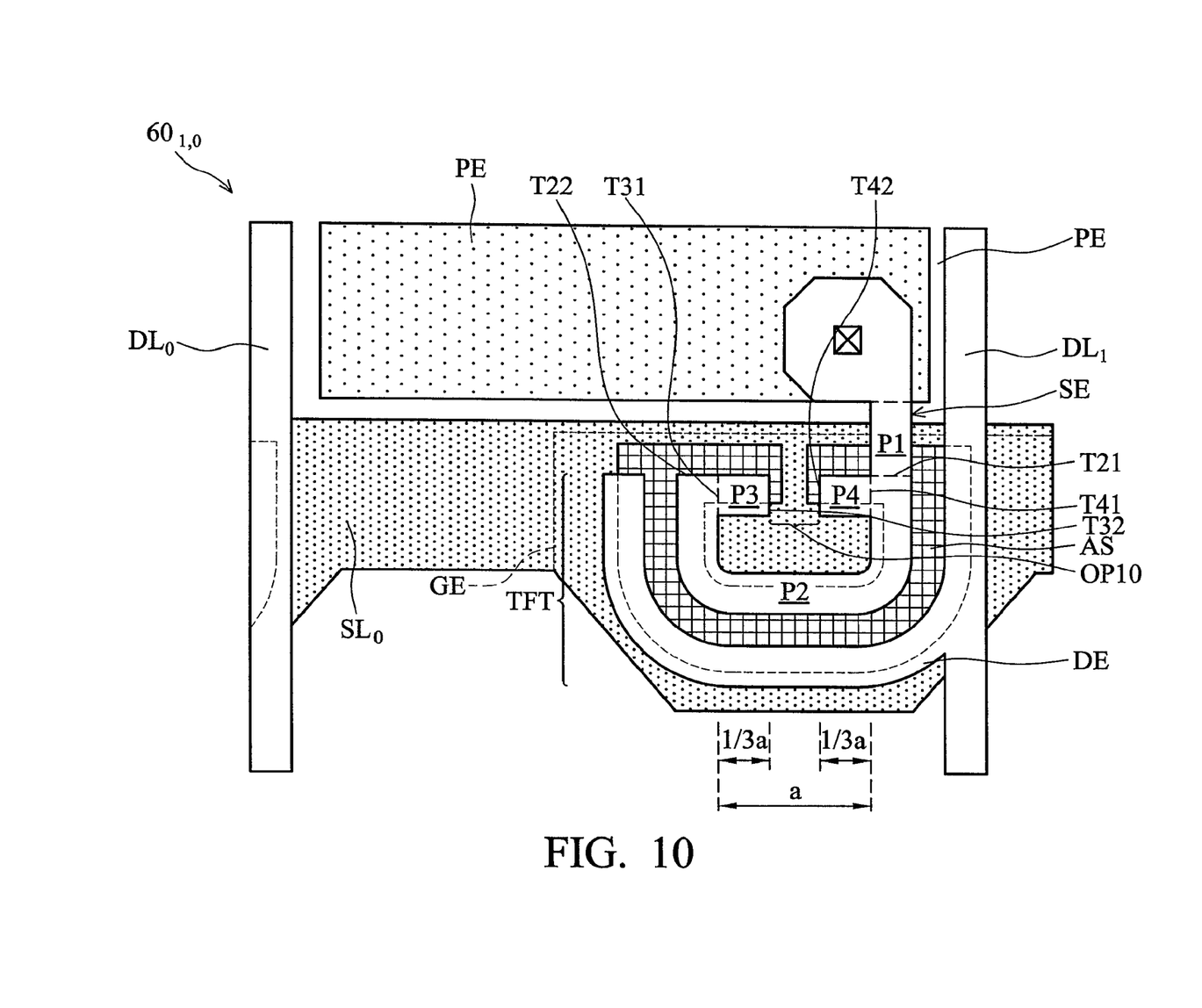
FIG. 10 shows one exemplary embodiment of a switch transistor according to the invention.

FIG. 10 is another exemplary embodiment of a switch transistor according to the invention. As shown in FIG. 10, the difference between FIG. 10 and FIG. 8 is that the source electrode SE further comprises a fourth portion P4. The fourth portion P4 comprises a first terminal T41 and a second terminal T42. The first terminal T41 of the fourth portion P4 is connected to the first terminal T21 of the second portion P2. The fourth portion P4 extends from the first terminal T21 of the second portion P2 to the second terminal T32 of the third portion P3 and is not connected to the second terminal T32 of the third portion P3. An opening OP10 is thus formed between the second terminal T32 of the third portion P3 and the second terminal T42 of the fourth portion P4. The opening OP10 corresponds to the opening OP7 of the concave area. As shown in FIG. 10, the fourth portion P4 is formed in a straight shape, and the third portion P3 is symmetrical to the fourth portion P4. In some embodiments, the shape of the fourth portion P4 can be formed in a curved shape according to applications, without limitation. Moreover, the third portion P3 does not have to be symmetrical to the fourth portion P4. In some embodiments, the extended length of the third portion P3 and the fourth portion P4 is not equal.

In FIG. 10, the distance between the first terminal T21 and the second terminal T22 of the second portion P2 is equal to a, and the distance between the second terminal T32 of the third portion P3 and the second terminal T42 of the fourth portion P4 is equal to a/3. Since the third portion P3 is symmetrical to the fourth portion P4, the extended length of each of the third portion P3 and the fourth portion P4 is equal to a/3. In some embodiments, the extended length of the third portion P3 and the fourth portion P4 can be determined according to applications, without limitation.

According to FIG. 10, since the source electrode SE comprises the fourth portion P4, the semiconductor layer AS is further disposed along the fourth portion P4.

According to the switch transistor TFT in FIG. 10, since the source electrode SE comprises the fourth portion P4, process inaccuracy can be partially compensated by the up and down sides of the switch transistor TFT and completely compensated by the left and right sides of the switch transistor TFT. The overlapping area between the semiconductor layer AS and the source/drain electrode SE/DE can substantially remain equal and not be affected by the mask alignment error.

In above embodiments, since the length of the channel is increased, the charging capability of the switch transistor TFT is enhanced. When mask alignment error occurs during the process, process inaccuracy can be compensated for by the above structure of the switch transistor TFT.

Figure 11:
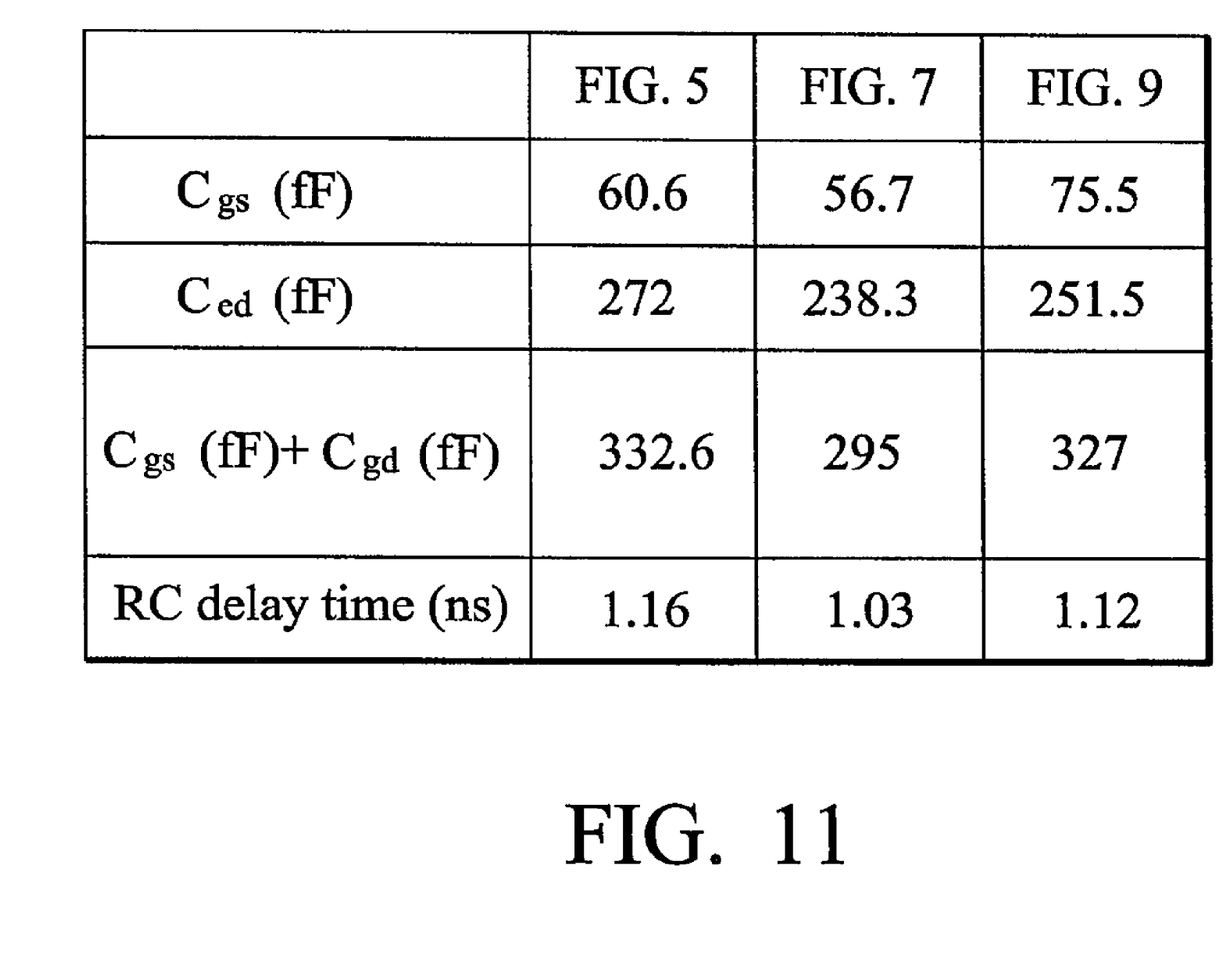
FIG. 11 shows the gate-source capacitor ($C_{gs}$) and the gate-drain capacitor ($C_{gd}$) in FIGS. 5, 7, and 9.

FIG. 11 shows the gate-source capacitor ($C_{gs}$) and the gate-drain capacitor ($C_{gd}$) in FIGS. 5, 7, and 9. Referring to FIG. 11, the sum $C_{sum}$ of the gate-source capacitor ($C_{gs}$) and the gate-drain capacitor ($C_{gd}$) in FIGS. 7 and 9 is less than the sum $C_{sum}$ in FIG. 5. Thus, the RC delay time resulted by the structure of FIGS. 7 and 9 is less than the RC delay time resulted by the conventional structure of FIG. 5.

In above embodiments, the width of the source electrode SE is preferably between 1 um and 200 um. The width of the channel CH formed by the semiconductor layer AS between the source electrode SE and the drain electrode DE is preferably between 1 um and 100 um. The distance between the first terminal T21 and the second terminal T22 of the second portion P2 is equal to the value "a" which is preferably between 1 um and 200 um.

Figure 12:
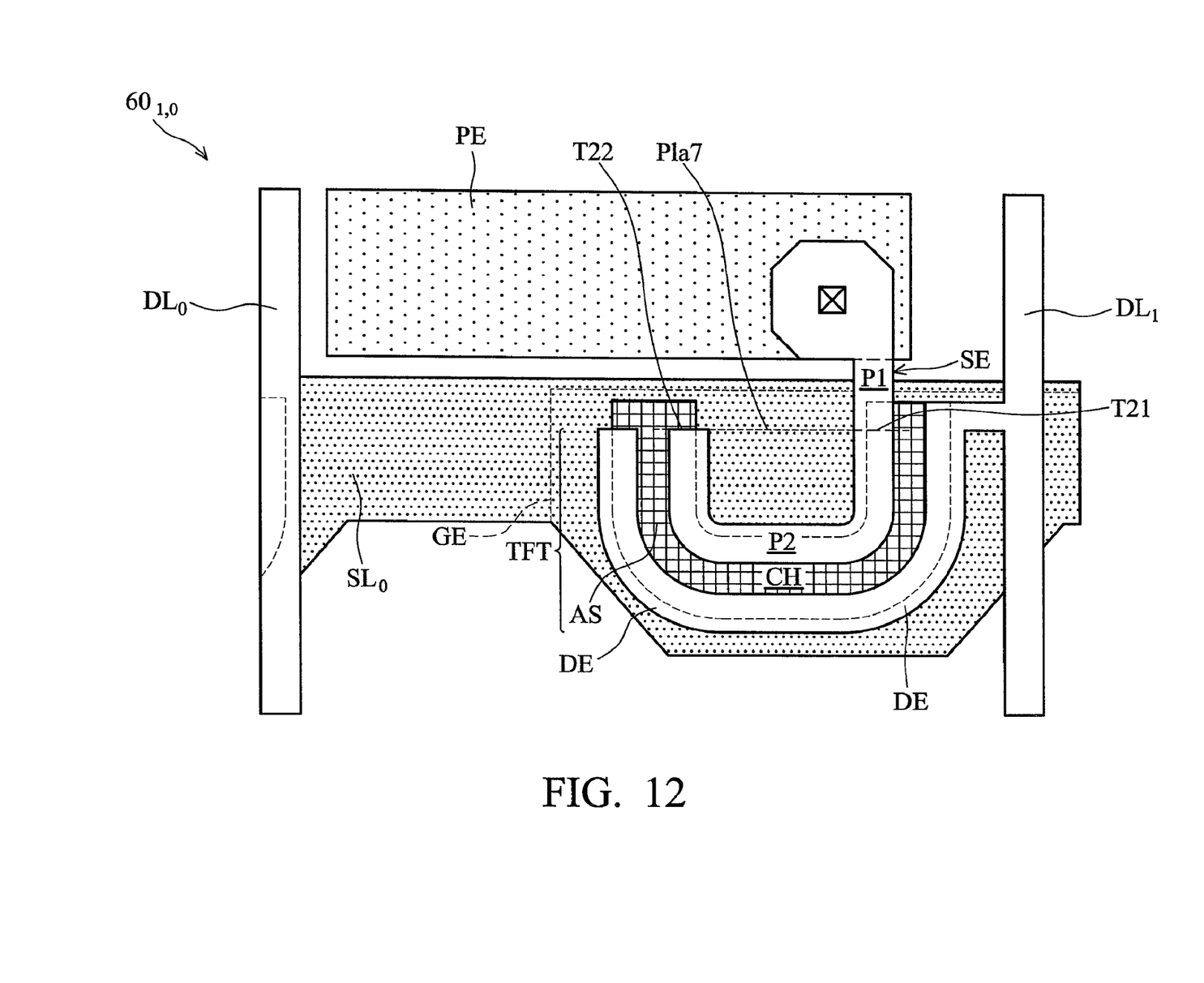
FIG. 12 shows one exemplary embodiment of a switch transistor according to the invention.

In the above embodiments, the channel CH is formed between the drain electrode DE with the data line $DL_1$ and the source electrode SE. In some embodiments according to the invention, as shown in FIG. 12, the channel is formed between the drain electrode DE and at least one portion of the source electrode SE. In FIG. 12, the channel CH is formed between the drain electrode DE and the first and second portions of the source electrode SE. The channel CH comprises a curved portion and at least one straight portion. The curved portion of the channel CH is between the curved structure of the second portion P2 and the drain electrode DE. In the embodiment of FIG. 12, the channel CH comprises a first straight portion parallel with the first portion P1. The first straight portion of the channel CH is the right part of the channel CH. The first straight portion is formed between the drain electrode DE and the first and second portions P1 and P2 and extends toward the same direction as the first portion P1. The channel CH further comprises a second straight portion parallel with the first portion P1. The second straight portion of the channel CH is the left part of the channel CH. The second straight portion is formed between the drain electrode DE and the second portion P2 of the source electrode SE and extends toward the same direction as the first portion P1.

In some embodiments, the channel CH can be formed between the drain electrode DE and the second portion P2. The first straight portion is the right part of the channel CH and formed between the drain electrode DE and the second portion P2. According to above description, the channel CH comprises a shape of a "C" form or a semicircle, or the channel CH is formed in a curved shape of a "U" form.

As described above, in the embodiments according to invention, the curved structure of the source electrode is provided to increase the channel width of the switch transistor and further enhance the charging capability of the switch transistor. Moreover, process inaccuracy resulting from mask alignment errors can be compensated for by the above structure of the switch transistor TFT.

While the invention has been described by way of examples and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pixel comprising:
   a pixel electrode;
   a data line; and
   a switch element comprising:
   a gate electrode;
   a first electrode electrically connected to the pixel electrode and comprising a first portion and a second portion, wherein the first portion is positioned in a vertical direction and comprises a first terminal and a second terminal respectively located on the top and bottom position thereof, and the second portion has a first curved structure which extends from the second terminal of the first portion to form a first concave area, wherein the second portion comprises a first terminal connected to the second terminal of the first portion and a second terminal, the first terminal of the second portion is substantially aligned with the second terminal thereof in a horizontal direction, and there is a first distance between the first terminal and the second terminal of the second portion in the horizontal direction, wherein the first curved structure is a U or a semicircle shape structure having a first opening facing the pixel electrode;
   a second electrode electrically connected to the data line, wherein the second electrode forms or the second electrode and a portion of the data line together form a second concave area where the first concave area is disposed in, wherein the second electrode and the portion of the data line together constructed a second curved structure which in a U or a semicircle shape having a second opening facing the pixel electrode; and
   a semiconductor layer disposed between the first electrode, the second electrode, and the gate electrode.

2. The pixel as claimed in claim 1, wherein the first electrode further comprises a third portion extending from the second terminal of the second portion to the first terminal thereof in the horizontal direction, wherein the third portion comprises a first terminal connected to the second terminal of the second portion and a second terminal which faces to but separates from the first terminal of the second portion.

3. The method of recording data on a storage medium as claimed in claim 1, determining a recording status of the data recording comprises determining the data recording is complete when the first and second indicators satisfy a predetermined condition.

4. The method of recording data on a storage medium as claimed in claim 3, further comprising if the first and second indicators do not satisfy a predetermined condition, performing a data recovery on the storage medium.

5. The pixel as claimed in claim 2, wherein the first electrode further comprises a fourth portion extending from the first terminal of the second portion to the second terminal in the horizontal direction of the third portion, wherein the fourth portion comprises a first terminal connected to the first terminal of the second portion and a second terminal which faces to but separates from the second terminal of the third portion.

6. The pixel as claimed in claim 1 further comprising a channel formed between the first electrode and the second electrode and comprising a curved portion and a first straight portion.

7. The pixel as claimed in claim 6, wherein the channel further comprises a second straight portion formed between the second electrode and the second portion of the first electrode, and the first and second straight portions are respectively disposed on two sides of the curved portion.

8. The pixel as claimed in claim 6, wherein the channel comprises a shape of a "C" form or a semicircle.

9. The pixel as claimed in claim 6, wherein the channel is formed in a curved shape of a "U" form.

10. The pixel as claimed in claim 1 further comprising a channel formed between the first electrode and the second electrode with the data line and comprising a curved portion and a first straight portion.

11. The pixel as claimed in claim 10, wherein the first straight portion is formed between the data line and the first electrode.

12. A switch element comprising:
    a gate electrode;
    a first electrode electrically connected to the pixel electrode and comprising a first portion and a second portion, wherein the first portion is positioned in a vertical direction and comprises a first terminal and a second terminal respectively located on the top and bottom position thereof, and the second portion has a first curved structure which extends from the second terminal of the first portion to form a first concave area, wherein the second portion comprises a first terminal connected to the second terminal of the first portion and a second terminal, the first terminal of the second portion is substantially aligned with the second terminal thereof in a horizontal direction, and there is a first distance between the first terminal and the second terminal of the second portion in the horizontal direction, wherein the first curved structure is a U or a semicircle shape structure having a first opening;
    a second electrode forming a second concave area where the first concave area is disposed in, wherein the second electrode constructed a second curved structure which in a U or a semicircle shape having a second opening, and the first and the second openings are faced the same direction; and
    a semiconductor layer disposed between the first electrode, the second electrode, and the gate electrode.

13. The switch element as claimed in claim 12, wherein the first electrode further comprises a third portion extending from the second terminal of the second portion to the first terminal thereof in the horizontal direction, wherein the third portion comprises a first terminal connected to the second terminal of the second portion and a second terminal which faces to but separates from the first terminal of the second portion.

14. The system of recording data on a storage medium as claimed in claim 11, wherein if the first and second indicators do not satisfy a predetermined condition, the determination unit determines to perform a data recovery on the storage medium.

15. The switch element as claimed in claim 14, wherein the first electrode further comprises a fourth portion extending from the first terminal of the second portion to the second terminal in the horizontal direction of the third portion, wherein the fourth portion comprises a first terminal connected to the first terminal of the second portion and a second terminal which faces to but separates from the first terminal of the second portion.

16. The switch element as claimed in claim 15, wherein the second terminal of the third portion is connected to the second terminal of the fourth portion.

17. The switch element as claimed in claim 12 further comprising a channel formed between the first electrode and the second electrode and comprising a curved portion and a first straight portion.

18. The switch element as claimed in claim 17, wherein the first straight portion is formed between the second electrode and the first and second portions of the first electrode.

19. The switch element as claimed in claim 17, wherein the first straight portion is formed between the second electrode and the second portion of the first electrode.

20. The switch element as claimed in claim 19, wherein the channel further comprises a second straight portion formed between the second electrode and the second portion of the first electrode, and the first and second straight portions are respectively disposed on two sides of the curved portion.

21. The switch element as claimed in claim 17, wherein the curved portion is formed between the second electrode and the first curved structure of the first electrode.

* * * * *